United States Patent
Baltar et al.

(10) Patent No.: US 6,456,540 B1
(45) Date of Patent: Sep. 24, 2002

(54) METHOD AND APPARATUS FOR GATING A GLOBAL COLUMN SELECT LINE WITH ADDRESS TRANSITION DETECTION

(75) Inventors: Robert Baltar, Folsom; Ritesh Trivedi, Orangevale, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/773,140

(22) Filed: Jan. 30, 2001

(51) Int. Cl.$^7$ ................................................ G11C 7/00
(52) U.S. Cl. ................. 365/189.09; 365/233.5
(58) Field of Search ................ 365/189.09, 230.06, 365/189.04, 189.01, 233.5, 210

(56) References Cited

U.S. PATENT DOCUMENTS

| | | |
|---|---|---|
| 4,742,292 A | 5/1988 | Hoffman |
| 4,763,026 A | 8/1988 | Tsen et al. |
| 5,305,273 A * | 4/1994 | Jinbo ........................ 365/210 |
| 5,508,958 A | 4/1996 | Fazio et al. |
| 5,539,690 A | 7/1996 | Talreja et al. |
| 5,594,360 A | 1/1997 | Wojciechowski |
| 5,594,691 A * | 1/1997 | Bashir ................... 365/189.09 |
| 5,608,669 A | 3/1997 | Mi et al. |
| 5,642,308 A | 6/1997 | Yoshida |
| 5,671,179 A | 9/1997 | Javanifard |
| 5,748,546 A | 5/1998 | Bauer et al. |
| 5,793,671 A | 8/1998 | Selcuk |
| 5,821,806 A | 10/1998 | Pascucci |
| 5,828,616 A | 10/1998 | Bauer et al. |
| 5,859,798 A | 1/1999 | Yero |
| 5,912,838 A | 6/1999 | Chevallier |
| 5,986,937 A | 11/1999 | Yero |
| 6,034,888 A | 3/2000 | Pasotti et al. |
| 6,097,633 A | 8/2000 | La Placa |
| 6,141,252 A | 10/2000 | Chen |
| 6,320,808 B1 | 11/2001 | Conte et al. |

OTHER PUBLICATIONS

Intel Corp., "Boot Block Flash Memory: Understanding ATD Circuitry" support.intel.com/support/flash/memory/bootblock/24582.HTM, pp. 1–4, Sep. 8, 2000.

Intel Corp., "3–Volt Advanced and Boot Block Flash Memory" Order #290645–009, pp. 7–22 and 57, Apr. 24, 2000.

* cited by examiner

*Primary Examiner*—Hoai V. Ho
*Assistant Examiner*—Thong Le
(74) *Attorney, Agent, or Firm*—Dennis A. Nicholls

(57) ABSTRACT

A method and apparatus for a memory device is described. In one embodiment, global Y (GY) enable is gated by the trailing edge of a address transition detection (ATD) pulse. The ATD pulse ensures that the GY enable is off during periods when the memory device is not attempting to read a memory cell. The sense (SEN) node between the GY transistor and drain bias circuit may be charged up and global bit line (GBL) may be grounded. During this time, the power supply current is cut off by the GY transistor itself, thereby eliminating the need of separate cut-off transistors within the drain bias circuit. This permits minimal time delay in sensing after the incoming address is stable.

19 Claims, 7 Drawing Sheets

METHOD AND APPARATUS FOR GATING A GLOBAL COLUMN SELECT LINE WITH ADDRESS TRANSITION DETECTION

FIELD OF THE INVENTION

The present invention relates generally to memory read circuits, and more specifically to sensing cell elements in a flash memory device.

BACKGROUND OF THE INVENTION

Semiconductor memory devices utilize large numbers of small storage elements, called "cells", that are organized in regular arrays. Reading data stored in these storage elements is the function of decoding circuits and sense amplifiers. In a typical semiconductor memory, the row decoding circuits are labeled "X decoders" and the column decoding circuits are labeled "Y decoders." When an address is supplied to the semiconductor memory device, the X decoders and Y decoders select the appropriate cell or cells which correspond to that particular address.

Referring now to FIG. 1, a schematic diagram of the read sensing circuits in a memory device is shown. The FIG. 1 circuit shows an exemplary memory cell, flash cell 118, in an "flash" electronically programmable read-only memory (EPROM). When properly biased, and when a positive voltage is applied to the gate of flash cell 118, a current $i_C$ flows in the drain of flash cell 188. The current $i_C$ will differ depending upon there being a logical "1" or "0" stored in flash cell 118. Exemplary values are $i_C$=10 microamps for a "1" and $i_C$=30 microamps for a "0".

In order to properly bias flash cell 118 for read sensing, a drain bias circuit 110 is employed. Flash cell 118 is selected when X decoders present X enable signal on X enable terminal 144, and when the Y decoders present global Y (GY) enable signal on GY enable terminal 142. When GY transistor 114 is turned on by GY enable signal, current can then flow from the drain bias circuit 110 first through sensing node (SEN node) 112 and thence through flash cell 118. In the FIG. 1 example, for the sake of clarity only one flash cell 118 is shown per column. Other similar devices (not shown) will be attached to the source of GY transistor 114 at global bit line (GBL) 116.

Drain bias circuitry 110 includes a controlled resistance that converts the current $i_C$ into a voltage capable of being sensed by sense amplifier 130. This voltage is supplied over sense input/read input (SIN/RIN) signal line 140 to one input 132 of sense amplifier 130. A duplicate of the drain bias circuit 110, flash cell 118, and GY transistor 114, drain bias circuit 120, reference cell 128, and dummy GY transistor 124, respectively, provide a means for providing a dummy current, $i_R$. These dummy circuits permit the construction of a standard reference voltage to be presented to alternate input 134 of sense amplifier 130. In an exemplary case $i_R$=20 microamps, halfway between the extremes of $i_C$ values.

Drain bias circuits 110, 120 and sense amplifier 130 consume a large portion of the supply current of the memory device. Therefore many designs turn off sense amplifier 130 when not actually reading data. Similarly, drain bias circuits 110, 120 may be disabled by placing cut-off transistors into the supply current path, preventing drain bias circuits 110, 120 from consuming current when not actually reading data. However, placing such cut-off transistors within drain bias circuits may require making the cut-off transistors relatively large. Other shortcomings of such placement may include complexities of driving SEN node 112.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A method and apparatus for a memory device is described. In one embodiment, global Y (GY) enable is gated by the trailing edge of a address transition detection (ATD) pulse. The ATD pulse ensures that the GY enable signal is inactive during periods when the memory device is not attempting to read a memory cell. The same ATD pulse may ground the global bit line (GBL) using a column pull-off. The sense (SEN) node between the GY transistor and drain bias circuit may be charged up and GBL may be grounded. During this time, the path from Vcc to Vss is cut off by the GY transistor itself, thereby eliminating the need of separate cut-off transistors within the drain bias circuit.

When the drain bias current flows through the GY transistor, the SEN node is pulled down by charge sharing with the GBL. Now the SEN node capacitance is small compared with that of GBL, and therefore the speed of bit line charging is similar to prior art schemes. By adjusting the timing of ATD, the GY enable signal is forced to be the last signal in the set of decode signals to be turned on. In this manner both the GBL of the actual array and also the bit lines of the reference circuit may be turned ON at the same time. This matching in the decode timing of main and reference side improves sensing speed. Gating GY with trailing edge of ATD increases tolerance of changes in address decode timing (intermediates).

In one embodiment the GY enable signal is gated by the trailing edge of the adjusted ATD pulse. This trailing edge is delayed when there are multiple address transitions in rapid sequence, thereby delaying GY enable. This prevents current flowing from the drain bias circuit during spurious address states, promoting the increased tolerance of changes in address decode timing. The trailing edge of the adjusted ATD pulse may be timed to include the address decode delay time from the incoming address to the subsequent GY enable signal. This permits minimal time delay in sensing after the incoming address is stable.

Figure 2:
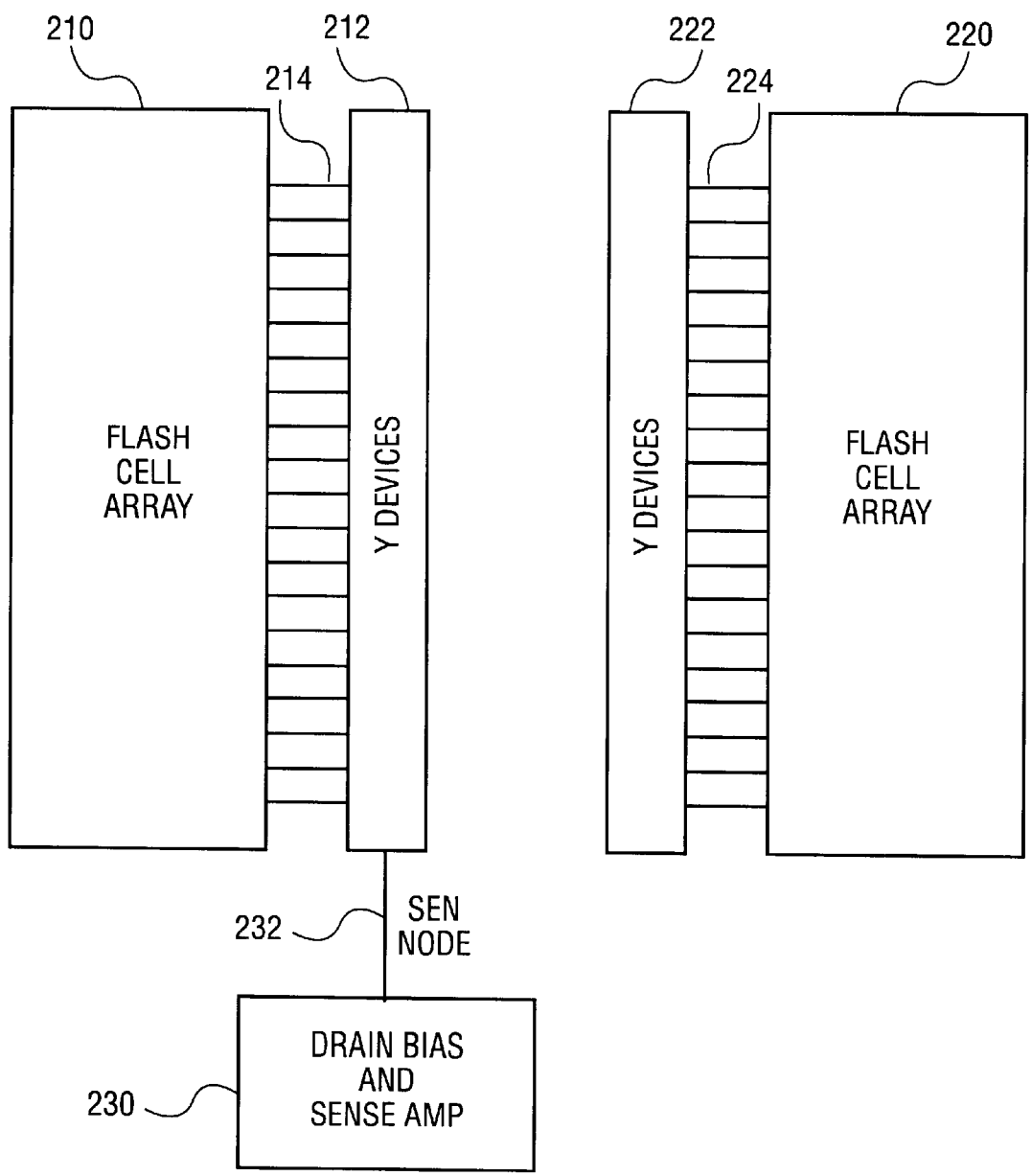
FIG. 2 is a diagram of the general physical layout of a memory device, including sense amps.

Referring now to FIG. 2, a diagram of the general physical layout of a memory device is shown, including sense amps. The FIG. 2 example is simplified for the sake of clarity, and shows only one drain bias and sense amplifier 230 with corresponding SEN node 232. The row and column implemented flash cell arrays 210, 220 may be in close proximity to the respective sets of GY transistors, shown as Y devices 212, 222. The sets of GBL, shown by exemplary GBLs 214, 224, are shown as having relatively short lengths and therefore small capacitance values. However, as the exemplary drain bias and sense amplifier circuit 230 is relatively far away from the corresponding Y devices 212, the exemplary SEN node 232 has a relatively long length and therefore larger capacitance value.

Figure 1:
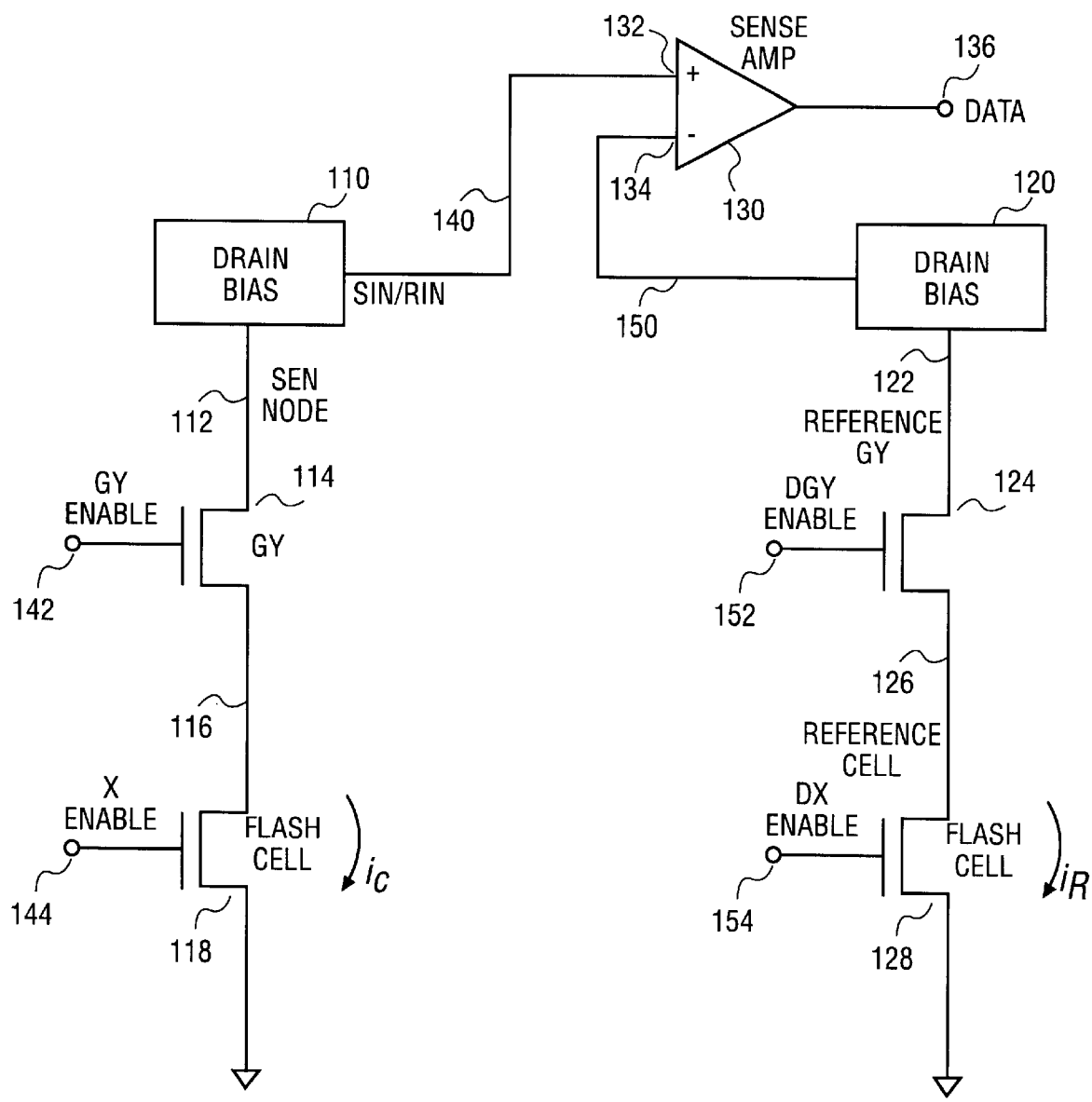
FIG. 1 is a schematic diagram of the read sensing circuits in a memory device.
Figure 3:
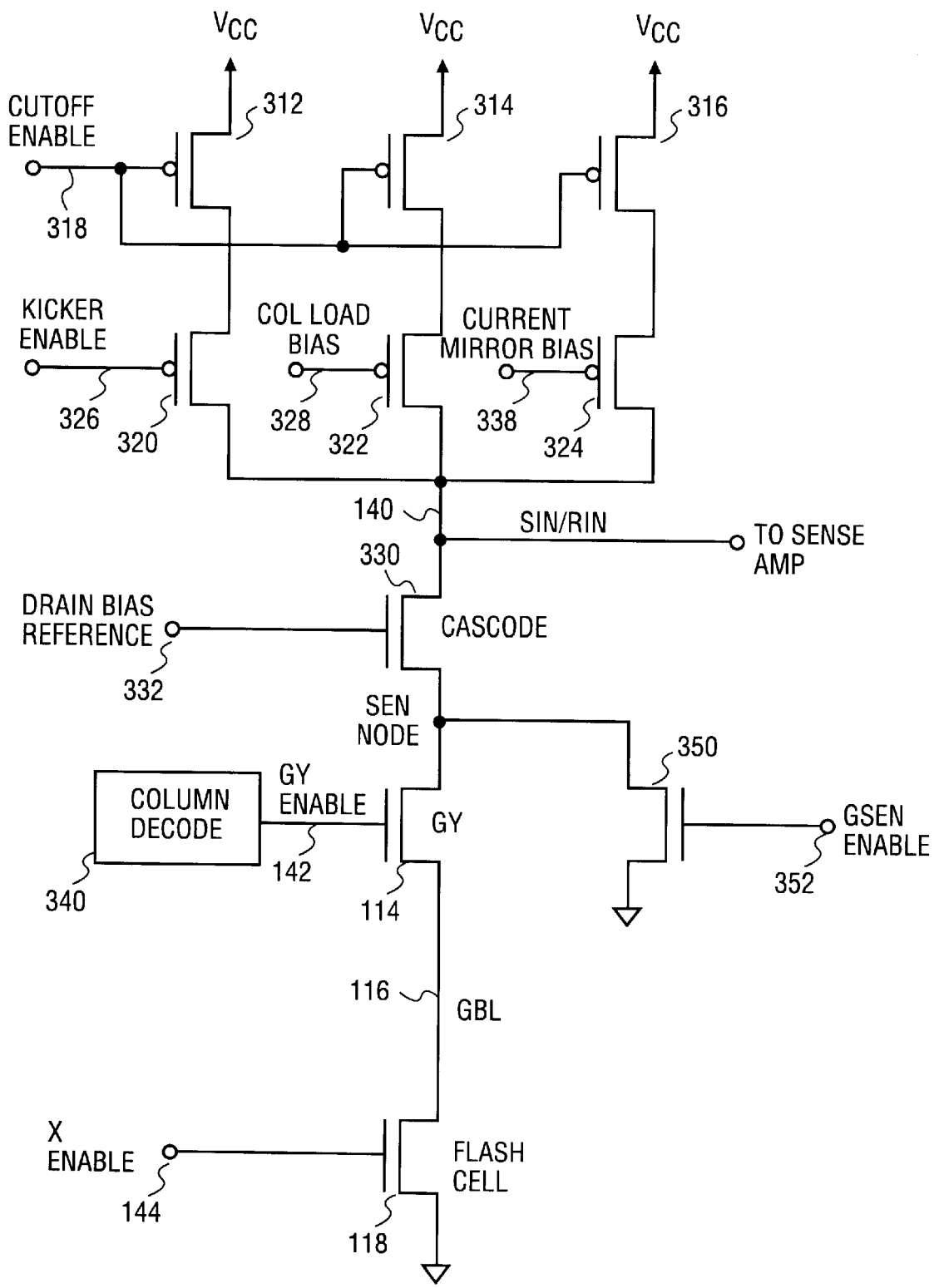
FIG. 3 is a detailed schematic diagram of a drain bias circuit.

Referring now to FIG. 3, a detailed schematic diagram of a drain bias circuit is shown. The circuit shown in FIG. 3 corresponds generally to the memory device of FIG. 2 and may be considered a portion of the read sensing circuits shown in FIG. 1. Cutoff transistors 312, 314, 316, kicker transistor 320, column load bias transistor 322, current mirror transistor 324, and cascode transistor 330 are the active elements of a drain bias circuit 110 of FIG. 1.

Column load bias transistor 322 and current mirror transistor 324 form the primary current source for sensing the state of flash cell 118. The gate of column load bias transistor 322 receives a column load biasing signal on column load biasing terminal 328. The gate of current mirror transistor 324 receives a current mirror biasing signal on current mirror biasing terminal 338. When biased in this manner, column load bias transistor 322 act as a resistor for supplying a sensing current for flash cell 118. The current mirror transistor 324 may additionally provide a common-mode current for flash cell 118 and for reference cell 128.

An additional kicker transistor 320 allows additional current to flow into the sense input/reference input (SIN/RIN) node 140 and SEN node 112 when the gate of kicker transistor 320 is supplied with a kicker enable signal on kicker enable terminal 326. The kicker transistor 320 permits more rapid initial charging of the SIN/RIN node 140 and SEN node 112 than would be possible using only column load bias transistor 322 and current mirror transistor 324.

Cutoff transistors 312, 314, 316 provide the ability to lower the current demand of the drain bias circuit. When the memory device is not reading the memory cells, the cutoff enable signal on cutoff enable terminal 318 is supplied to the gates of cutoff transistors 312, 314, 316, turning them off. When the drain bias circuit is needed for reading, the cutoff enable signal is turned off, turning cutoff transistors 312, 314, 316 on and thereby allowing current to flow in the drain bias circuit.

In order that the cutoff transistors 312, 314, 316 have a low on-resistance during read operations, the sizes of cutoff transistors 312, 314, 316 must be relatively large. In one embodiment, cutoff transistors 312, 314 are 30 micron devices and cutoff transistor 316 is a 40 to 50 micron device. These large cutoff transistors consume a disproportionate area in the memory device and are a drawback of this embodiment.

Cascode transistor 330 is driven just into saturation by the drain bias reference signal on drain bias reference terminal 332. This regulates the bit line voltage at about 1 volt.

Global Y (GY) transistor 114 is driven by the column decode logic 340, specifically by the GY enable signal on GY enable signal line 142. When column decode logic receives an address, many intermediate states may occur which may cause spurious signals on GY enable signal. For this reason the GY transistor 114 of this embodiment may turn on in response to spurious signals. Therefore, the SEN node 112 is tied to ground by ground SEN (GSEN) transistor 350 when the memory device is not performing a read sense operation. A GSEN enable signal on GSEN enable terminal 352 turns GSEN transistor 350 off only during times of read sensing.

The presence of the GSEN transistor, as well as the long path length of SEN node as discussed above in connection with FIG. 2, create a sizable capacitance in SEN node 112. It is not unusual for SEN node to have 3 picofarads capacitance in this configuration. This adds to the time required after turning on the drain bias circuit via cutoff transistors 312, 314, 316 before a valid read sense can be performed.

Figure 4:
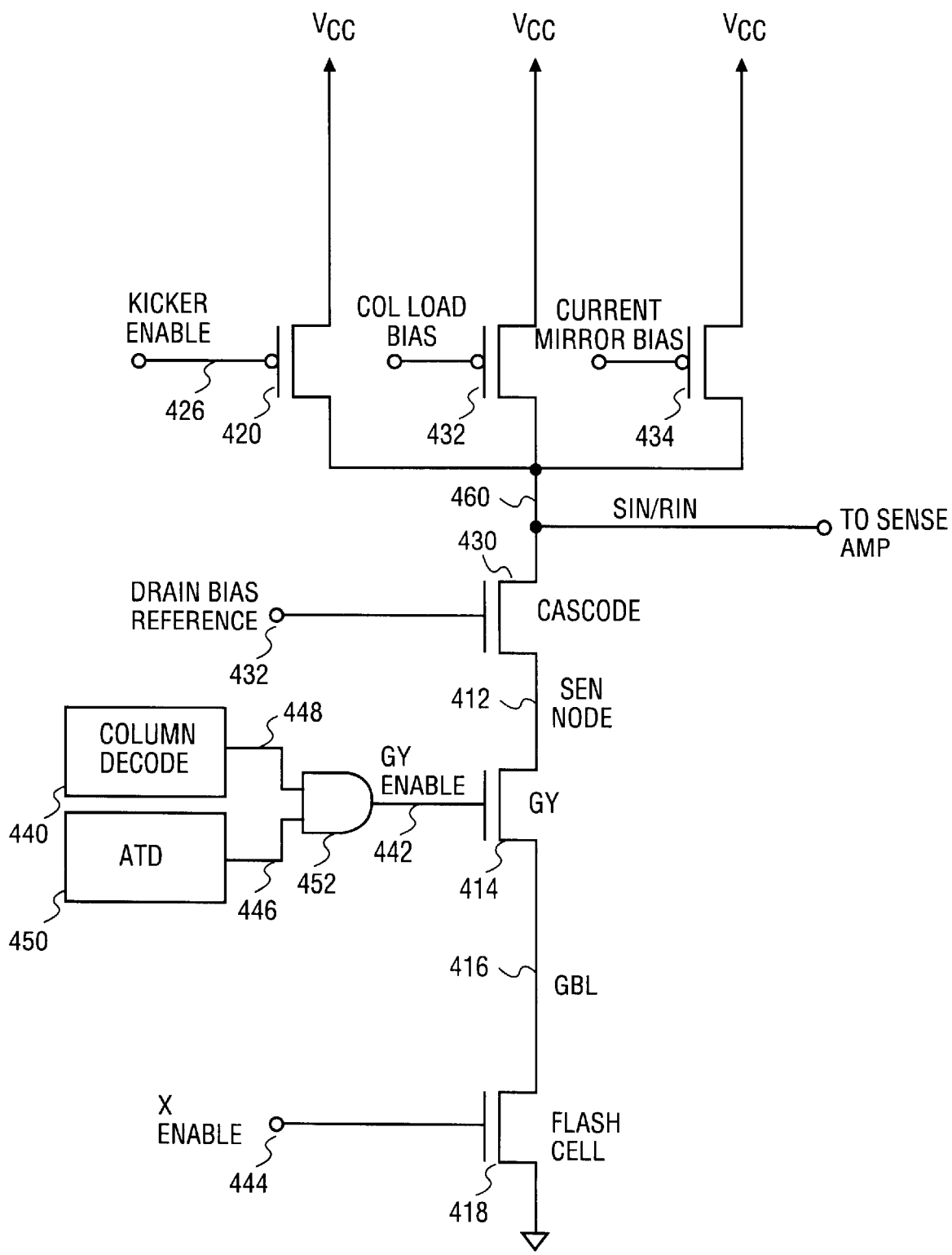
FIG. 4 is a detailed schematic diagram of a drain bias circuit, according to one embodiment of the present invention.

Referring now to FIG. 4, a detailed schematic diagram of a drain bias circuit is shown, according to one embodiment of the present invention. In the FIG. 4 embodiment, individual cutoff transistors 312, 314, 316 as shown in FIG. 3 are eliminated. The function of cutting off current in the drain bias circuitry for power conservation is now performed by the GY transistor 414.

Kicker transistor 420, column load transistor 432, and current mirror transistor 434 perform similar functions as the equivalent transistors in the FIG. 3 embodiment, as does cascode transistor 430. However, in the FIG. 4 embodiment the gate of GY transistor 414 is not driven by a signal derived solely by column decode circuit 440. Instead GY enable signal on GY enable signal path 442 is derived by gating a column decode signal on column decode signal path 448 with the ATD signal on ATD signal path 446. In one embodiment, the ATD signal is generated by ATD circuit 450 and is gated with column decode signal by logic gating 452. By gating the column decode signal with the ATD signal, this embodiment may prevent spurious signals on column decode signal from turning on GY transistor 414. Additionally, gating the column decode signal with the ATD signal prevents current from flowing down from the drain bias circuit, including kicker transistor 420, column load transistor 432, and current mirror transistor 434.

Because gating the column decode signal with the ATD signal may prevent spurious signals from turning on GY transistor 414, SEN node 412 will not be connected to GBL 416 when the memory device is not reading data. Therefore in this embodiment a grounding transistor, similar to GSEN transistor 350 of FIG. 3, is not necessary for grounding SEN node 412. Removing the capacitance of a grounding transistor, along with shortening the physical length of SEN node as discussed below in connection with FIG. 6, may reduce the capacitance of SEN node 412 to approximately 0.1 picofarads. This is significantly less than the 3 picofarads of the SEN node 112 of the FIG. 3 embodiment, allowing for more rapid sensing with smaller currents.

By gating the column decode signal with the ATD signal, this embodiment eliminates the three cutoff transistors 312, 314, 316 of the FIG. 3 circuit. This saves the layout area formerly consumed by these three relatively large devices.

Logic gate 452 is shown in FIG. 4 as a simple logic gate. In alternate embodiments, logic gate 452 may be a pulse generator responsive to the column decode signal and ATD signal. In one embodiment, logic gate 452 may delay the effect of ATD until the trailing edge of an ATD pulse. This timing may be used to ensure that GY enable signal is the last decoding signal to turn on in the memory cell read circuitry. This timing is discussed further in connection with FIGS. 5C and 5D below.

Kicker transistor 420, column load transistor 432, and current mirror transistor 434 are turned on shortly before ATD permits GY transistor 414 to turn on. Prior to GY transistor 414 being turned on, SEN node 412 is biased to approximately 1.4 volts because cascode transistor 430 is always turned on. When GY transistor 414 is turned on in response to the column decode signal gated by the ATD signal, SEN node 412 is initially pulled down in voltage by GBL 416 through the process of charge sharing.

Alternate embodiments using similar scheme of gating decoding signal with trailing edge of ATD may be deployed for other decode paths resulting in power saving.

In the FIG. 4 embodiment, SEN node 412 more rapidly charges to approximately 1 volt for sensing than in the FIG. 3 circuit since SEN node 412 is not directly grounded through the action of a grounding GSEN transistor. Even though the charging of SEN node 412 is more rapidly accomplished, the lower capacitance of SEN node 412 mitigates the effect of voltage overshoot in GBL 416 when GBL 416 in turn charges up for sensing. Voltage overshoot may in some cases disturb the setting of flash cell 418 itself. The lower capacitance of SEN node 412 also permits utilizing a smaller cascode transistor 430 than the cascode transistor 330 of the FIG. 3 circuit, since the SEN node 412 and GBL 416 charging is more rapidly accomplished in the FIG. 4 embodiment.

Figure 5A:
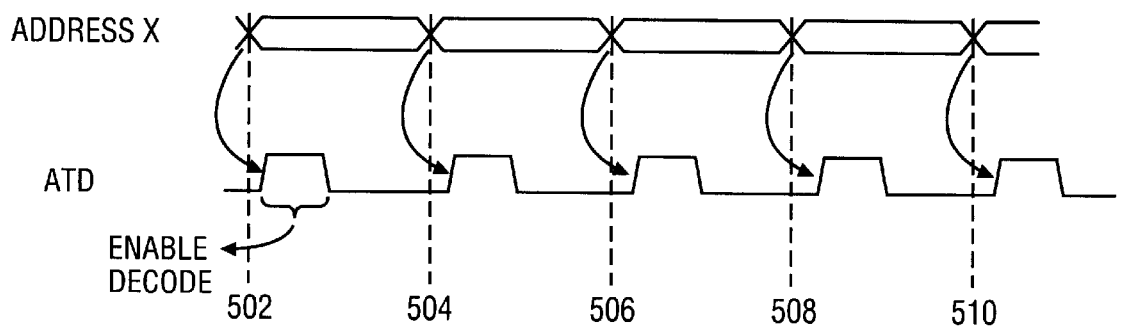
FIGS. 5A, 5B, 5C and 5D are timing diagrams of the ATD signal, according to several embodiments of the present invention.
Figure 5B:
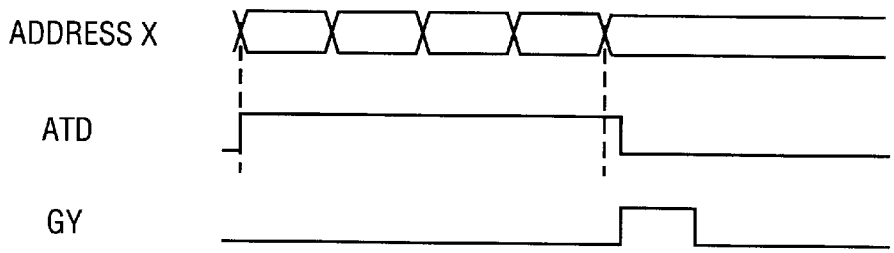
Figure 5C:
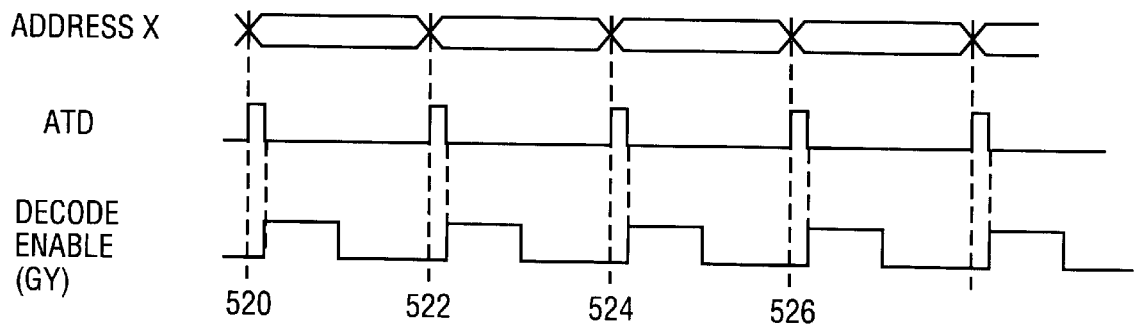

Referring now to FIGS. 5A, 5B, 5C and 5D, timing diagrams of the ATD signal are shown, according to several embodiments of the present invention. FIG. 5A shows a typical implementation of ATD. Whenever there is activity (e.g. change of address line state) in the address lines reaching the memory device, ATD becomes a active level. For example, let the address X lines be a combination of all of the address lines. Address line state changes occur at times 502, 504, 506, 508, and 510. The circuitry generating ATD signal initially keeps ATD signal inactive. Then at time 502, in response to activity on the address X lines, ATD switches to active. During the subsequent address X transitions at times 504, 506, 508, and 510, ATD generates a pulse. ATD generates a pulse. For fast addressing (less than specification), ATD will overlap and we will get only one long pulse for ATD as shown in FIG. 5B. Trailing edge is pushed out all the way till valid address toggling. Since GY is turned ON with the trailing edge of ATD as shown in FIG. 5C, GY will remain off for the invalid address transitions. This will prevent unnecessary charging of SEN node and will eliminate impact on fast addressing cycling on sensing. This scheme also reduces power due to intermediate switching.

Figure 5D:
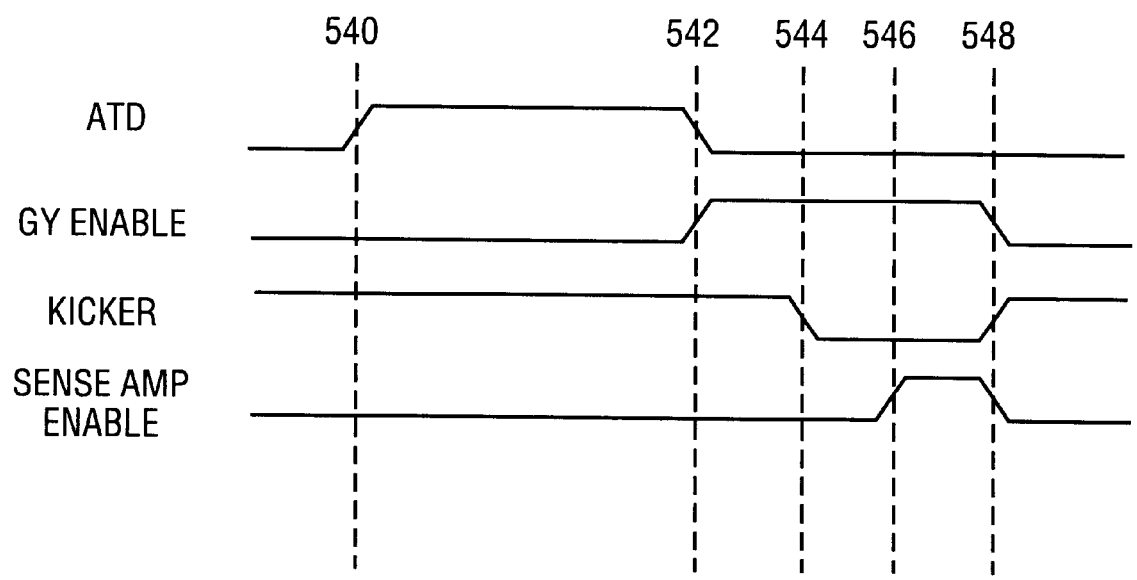

FIG. 5D illustrates another embodiment of timing signals which are related to ATD. In one embodiment, the FIG. 5D ATD signal is timed in accordance with FIG. 5A, in alternate embodiments the FIG. 5D ATD signal is in accordance with FIG. 5C. In either case, the trailing edge of ATD signal, at time 542, initiates the GY enable signal at the gate of GY transistor 414 of FIG. 4. At subsequent time, 544, kicker enable signal becomes inactive. Kicker is ON providing low impedance path for bit line charging when GY is enabled. The GY transistor 414 turns on enabling the current to flow from the drain bias circuit through the selected column device. Then at a subsequent time, 546, a sense amp enable signal becomes active, permitting the sense amplifier to sense the read state of the selected flash cell.

Figure 6:
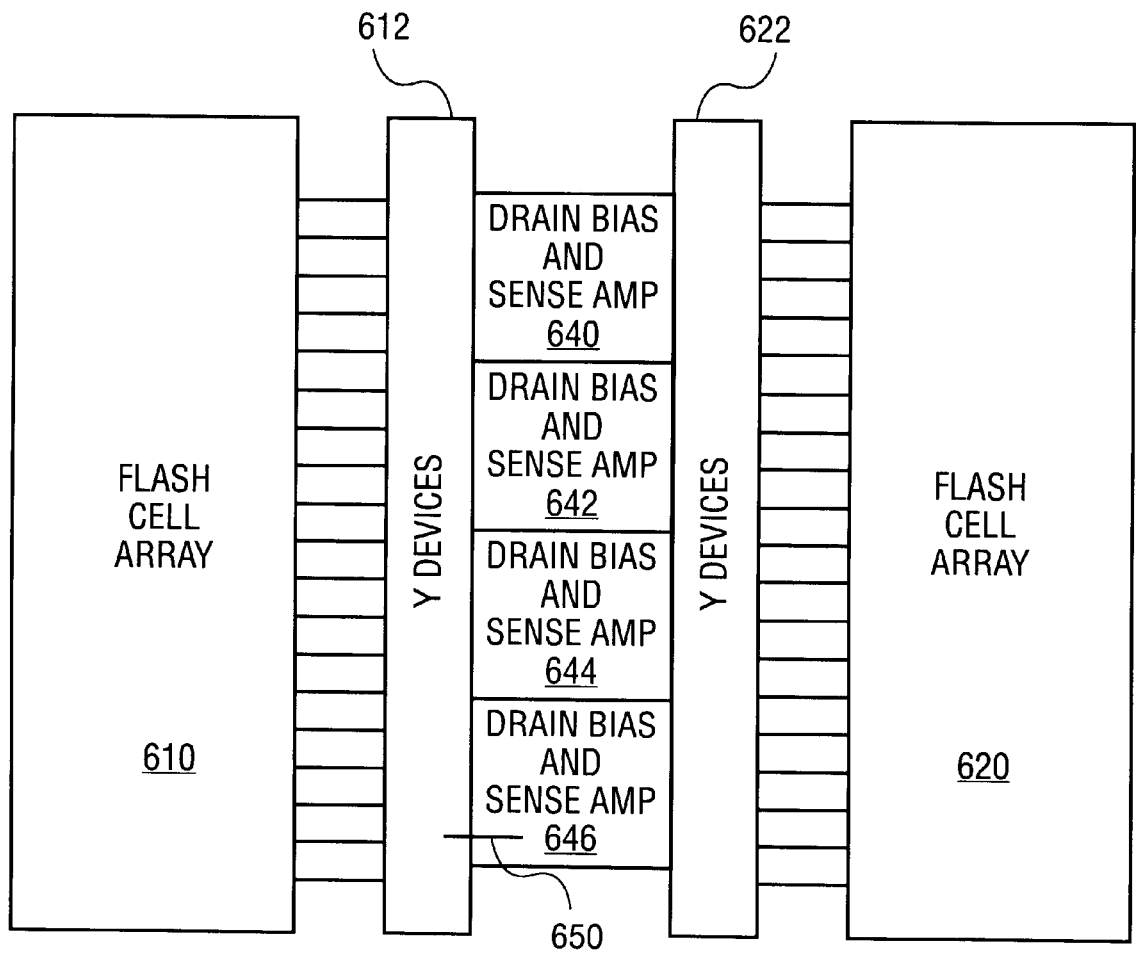
FIG. 6 is a diagram of the general physical layout of a memory device, including sense amps, according to one embodiment of the present invention.

Referring now to FIG. 6, a diagram of the general physical layout of a memory device is shown, including sense amps, according to one embodiment of the present invention. In the FIG. 6 embodiment, the memory is organized around words of 16 bits wide (called "X16" memory) or 64 bits wide (called "X64" memory). In the 32 megabyte X64 memory shown in FIG. 6, there need to be 4 sets of drain bias and sense amplifier circuits 640, 642, 644, 646. Rather than place these drain bias and sense amplifier circuits 640, 642, 644, 646 at the end of the flash cell arrays as was done in the FIG. 2 example, drain bias and sense amplifier circuits 640, 642, 644, 646 are placed immediately between the sets of GY transistors, Y devices 612, 614. For the sake of clarity only one SEN node 650 of drain bias and sense amplifier 646 is shown. SEN node 650 is much shorter than SEN node 232 of FIG. 2, and therefore SEN node 650 has much reduced capacitance. In conjunction with the reduction in capacitance caused by the elimination of a GSEN transistor, SEN node 650 may have a capacitance as low as 0.1 picofarads. This lower capacitance value permits maximum utility from moving the cutoff function from the drain bias circuit, as shown in FIG. 3, to the GY transistor 414 of FIG. 4.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus, comprising:
   a drain bias circuit;
   a first transist to cut off current flow in said drain bias circuit when the apparatus is not performing a read operation in a first column coupled to said first transistor; and
   a memory cell coupled to said first column and said first transistor, wherein a gate of said first transistor is coupled to an address transition detection signal.

2. An apparatus, comprising:
   a drain bias circuit;
   a first transistor to cut off current flow in said drain bias circuit when the apparatus is not performing a read operation in a first column coupled to said first transistor; and
   a memory cell coupled to said first column and said first transistor, wherein a gate of said first transistor is coupled to a first signal gated by a column decode signal and an address transition detection signal.

3. The apparatus of claim 2, wherein said first signal is responsive to a trailing edge of said address transition detection signal.

4. The apparatus of claim 3, wherein said address transition detection signal is delayed after an initial address transition.

5. The apparatus of claim 3, wherein said first signal is further responsive to a first pulse generated in response to said trailing edge of said address transition detection signal.

6. An apparatus, comprising:
   a drain bias circuit;
   a first transistor to cut off current flow in said drain bias circuit when the apparatus is not performing a read operation in a first column coupled to said first transistor; and
   a memory cell coupled to said first column and said first transistor, further comprising a sense node, having a capacitance value less than 1.0 picofarad, coupled to said drain bias circuit and to said first transistor.

7. A method, comprising:
   providing a drain bias current;
   cutting off said drain bias current in a column decode transistor when not performing a read operation; and
   enabling flow of said drain bias current when said column decode transistor is selected for performing a read operation, wherein said cutting off includes coupling said column decode transistor to an address transition detection signal.

8. A method, comprising:

providing a drain bias current;

cutting off said drain bias current in a column decode transistor when not performing a read operation; and enabling flow of said drain bias current when said column decode transistor is selected for performing a read operation, wherein said cutting off includes coupling a gate of said first transistor to a first signal gated by a column decode signal and an address transition detection.

9. The method of claim 8, further comprising delaying said first signal to occur after a trailing edge of said address transition detection signal.

10. The method of claim 9, further comprising delaying said address transition detection signal to occur after an initial address transition.

11. The method of claim 9, further comprising delaying said first signal to occur after a first pulse is generated in response to said trailing edge of said address transition detection signal.

12. A method, comprising:

providing a drain bias current;

cutting off said drain bias current in a column decode transistor when not performing a read operation; and enabling flow of said drain bias current when said column decode transistor is selected for performing a read operation, further comprising reducing the capacitance of a sense node coupled to a source of said drain bias current and to said column decode transistor.

13. An apparatus, comprising:

means for providing a drain bias current;

means for cutting off said drain bias current in a column decode transistor when not performing a read operation; and means for enabling flow of said drain bias current when said column decode transistor is selected for performing a read operation, wherein said means for cutting off includes means for coupling said column decode transistor to an address transition detection signal.

14. An apparatus, comprising:

means for providing a drain bias current;

means for cutting off said drain bias current in a column decode transistor when not performing a read operation; and means for enabling flow of said drain bias current when said column decode transistor is selected for performing a read operation, wherein said means for cutting off includes means for coupling a gate of said first transistor to a first signal gated by a column decode signal and an address transition detection signal.

15. The apparatus of claim 14, further comprising means for delaying said first signal to occur after a trailing edge of said address transition detection signal.

16. The apparatus of claim 15, further comprising means for delaying said address transition detection signal to occur after an initial address transition.

17. The apparatus of claim 15, further comprising means for delaying said first signal to occur after a first pulse is generated in response to said trailing edge of said address transition detection signal.

18. The apparatus of claim 17, further including means for delaying said first pulse to occur after the leading edge of a kicker enable signal.

19. An apparatus, comprising:

means for providing a drain bias current;

means for cutting off said drain bias current in a column decode transistor when not performing a read operation; and means for enabling flow of said drain bias current when said column decode transistor is selected for performing a read operation, further comprising means for reducing a capacitance of a sense node coupled to a source of said drain bias current and to said column decode transistor.

* * * * *